May 30, 1972 N. W. BRACKELMANNS 3,666,573
METHOD FOR MAKING TRANSISTORS INCLUDING GAIN DETERMINING STEP
Filed Dec. 17, 1969 2 Sheets-Sheet 1

INVENTOR
Norbert W. Brackelmanns
BY
Glenn H. Bruestle
ATTORNEY

METHOD FOR MAKING TRANSISTORS INCLUDING GAIN DETERMINING STEP

Filed Dec. 17, 1969

2 Sheets-Sheet 2

INVENTOR
Norbert W. Brackelmanns
BY
[signature]
ATTORNEY

United States Patent Office 3,666,573

Patented May 30, 1972

3,666,573

METHOD FOR MAKING TRANSISTORS INCLUDING GAIN DETERMINING STEP

Norbert William Brackelmanns, Ironia, N.J., assignor to RCA Corporation

Filed Dec. 17, 1969, Ser. No. 885,699
Int. Cl. B01j *17/00;* H01l *7/00, 7/36*
U.S. Cl. 148—175 6 Claims

ABSTRACT OF THE DISCLOSURE

The method includes providing a uniformly thick base layer on a wafer of semiconductor material which is to become transistor collectors, and diffusing a plurality of separate emitter regions into the base layer. During emitter diffusion, a grid of like conductivity is diffused into the base layer and between adjacent emitter regions to isolate the active region of each transistor. A gain figure-of-merit is then measured for one transistor in the wafer, and if below a desired minimum, the emitter regions are rediffused. After achieving the desired gain, the transistors are separated from the wafer.

BACKGROUND OF THE INVENTION

Figure 1:
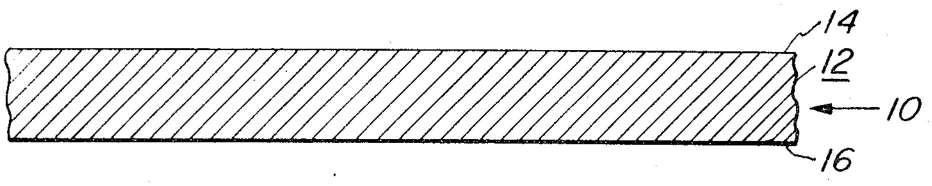
Figure 2:
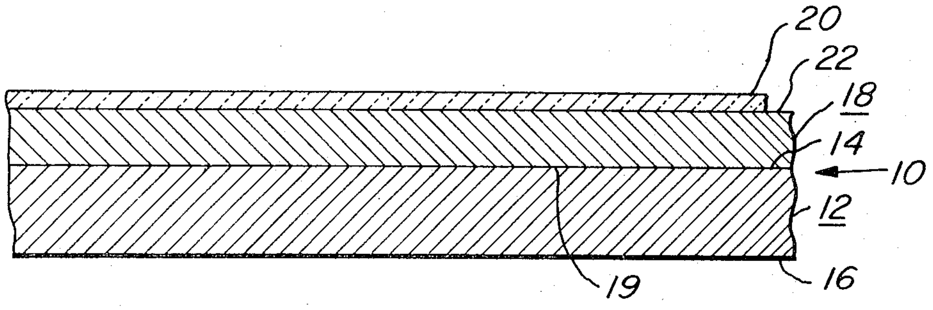

The present invention relates to methods for making semiconductor devices and more particularly, relates to transistor fabrication techniques which allow the gain of each transistor to be measured during the fabrication process.

The semiconductor industry presently employs a wide variety of methods for making transistors. However, several of these well-known processes are alike in that before the semiconductor wafer is metalized and diced into individual transistors, the wafer has a uniformly thick collector layer, a uniformly thick base layer adjacent the collector layer, and a plurality of spaced emitter regions diffused into the base layer.

Since the gain of a transistor made by such methods is related to the depth of emitter diffusion into the base layer, it is desirable to measure the gain of each device before the wafer is metalized and diced. Thus, if the gain is too low, the emitters may be rediffused until the desired gain is achieved. However, in those methods characterized as above, the gain is difficult to measure because any defect or short at the collector-base junction distorts the gain measured for all of the transistors formed in the wafer. It is therefore desirable to electrically isolate the active region of some, or all, of the transistors, so that the gain may be measured after emitter diffusion. One isolation technique that is presently used to measure the gain during processing employs a "moat" which is etched around one transistor on the wafer and down to the collector-base junction. While this method provides the desired isolation in order that gain may be determined, it often requires destruction of those devices adjacent the transistor being tested and also requires additional processing steps. It would therefore be more expedient to employ an isolation technique that allows the gain to be measured during processing, does not decrease the yield rate from a given wafer, and does not require additional processing steps.

SUMMARY OF THE INVENTION

The present invention comprises a method for making a plurality of transistors from a body of semiconductor material which has a first conductivity-type collector layer within the body, and a second conductivity-type base layer within the body adjacent the collector layer. The method includes diffusing a plurality of separate first conductivity-type emitter regions into the base layer, and diffusing a contiguous first conductivity-type region into the base layer and between adjacent emitter regions. This contiguous region serves to electrically isolate each emitter region and a portion of the base layer which is proximate to each emitter region, so that each isolated emitter region, each corresponding isolated portion of the base layer, and a corresponding portion of the collector layer form a transistor in the body. Afterwards, a gain figure-of-merit is determined for one or more of the transistors; if the gain is too low, the emitter regions are rediffused until the desired gain is achieved. Each tranisistor is then separated from the body.

THE DRAWING

FIGS. 1 to 6 are cross-sectional views of a semiconductor body during representative steps in a preferred embodiment of the method of the present invention.

DETAILED DESCRIPTION

A preferred embodiment of the present method will be described with reference to FIGS. 1 to 6, which illustrate representative steps in an epitaxial base method for making transistors from a semiconductor body. As shown in FIG. 1, the starting material for the body 10 comprises a semiconductor wafer 12 of a first conductivity-type having opposed upper and lower surfaces 14 and 16, respectively. Portions of the wafer 12 ultimately serve as collector regions for each of the transistors formed in the body 10. The size, shape, composition, and conductivity of the wafer 12 is not critical. In this embodiment, the wafer 12 comprises a standard disc of N type silicon which is 1.25" in diameter and 8.0 mils thick, having a resistivity of .015Ω·cm.

A base layer 18 (FIG. 2) of the same semiconductor material as that of wafer 12, but of a second conductivity-type, is epitaxially grown on the upper surface 14 of the wafer, forming a collector-base PN junction 19 between the layer 18 and the wafer 12. The thickness of the base layer 18 is not critical; in the present example, the base layer comprises a P type layer of silicon which is about 0.6 mil thick. Any epitaxial method is suitable for depositing the base layer 18.

An insulating coating 20 is thereafter deposited on the exposed upper surface 22 of the base layer 18. Suitable compositions for the coating 20 include silicon dioxide and silicon nitride. Preferably, the coating is between 8,000 and 10,000 A. thick.

Figure 3:
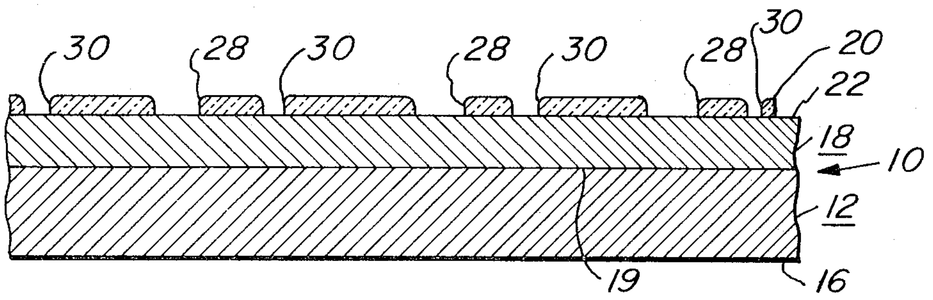
Figure 4:
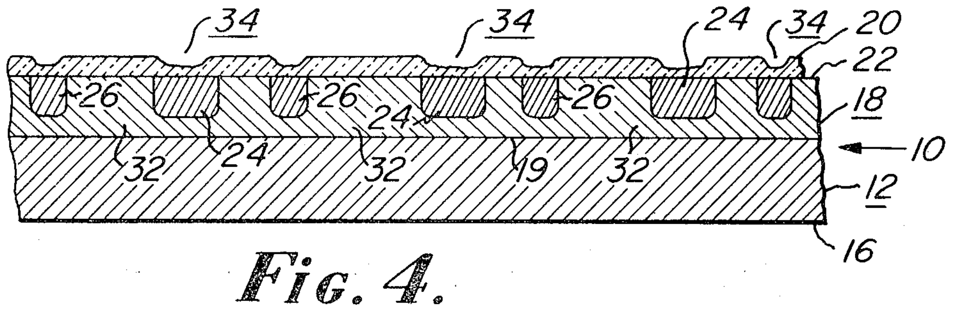

Referring to FIGS. 3 and 4, a plurality of separate first conductivity-type emitter regions 24 are diffused through the surface 22 and into the base layer 18. During emitter diffusion, a contiguous first conductivity-type grid 26 is also diffused through the surface 20 into the base layer 18 and between adjacent emitter regions 24. The depth of diffusion for the emitter regions 24 and the grid 26 is not critical, since the depth may later be more precisely adjusted, as hereinafter described. Other dimensions of the emitter regions 24 and the grid 26 are also not critical; preferably, however the grid 26 is at least 6.0 mils wide. In the present embodiment, both the emitter regions 24 and the contiguous grid 26 are N type.

Noting FIG. 3, the diffusion of the emitter regions 24 and the grid 26 is accomplished by conducting a photolithographic sequence, in which the insulating coating 20 is treated with a photoresist layer and masked with a pattern containing the emitters and the grid. The photoresist is then exposed and developed, and the coating is etched to remove the unprotected portions of the photoresist and coating, thereby opening emitter apertures 28 and grid apertures 30. The body 10 is then placed in a diffusion furnace and treated with an N type dopant, such as phosphorus oxychloride, to diffuse the emitter regions 24 and the grid 26 through the respective apertures 28, 30 and into the base layer 18. During this diffusion step, silicon dioxide is left deposited in the emitter and grid apertures 28, 30 and on the remaining portions of the insulating coating 20.

As shown in FIG. 4, the contiguous grid 26 serves to electrically isolate each emitter region 24 and a corresponding portion 32 of the base layer 18 which is proximate to each emitter region 24, from similar adjacent regions. This isolation occurs because the grid 26 substantially reduces the thickness of the base region 18 between each portion 32 of that region, thereby reducing the crosssection area and greatly increasing the resistance between each portion 32. The increased resistance between each base region portion 32 thus provides the desired isolation. Therefore, each isolated emitter region 24, each corresponding isolated portion 32 of the base region 18, and a corresponding portion of the collector layer 12 form a transistor 34 in the body 10.

Figure 5:
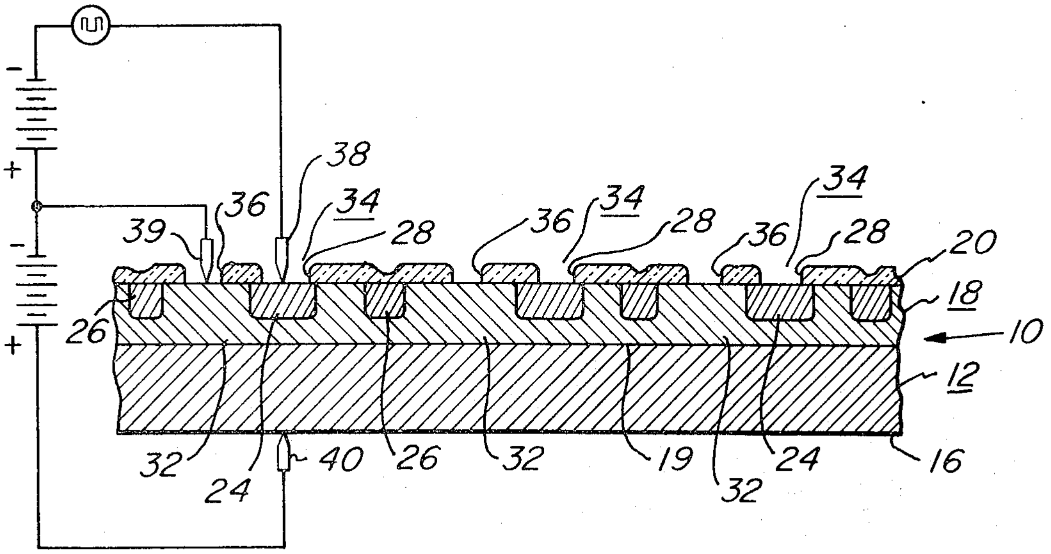

After diffusion of the emitter regions 24 and the isolation grid 26, a gain figure-of-merit is determined for one or more of the transistors 34. This is done by first treating the insulating coating 20 with a second photolithographic sequence, in order to reopen the emitter apertures 28 and to initially open base apertures 36. Each base aperture 36 exposes one base layer portion 32 at the surface 22 (FIG. 5). A metal probe is then placed in electrical contact with each semiconductor region of one of the transistors 34. In FIG. 5, probe 38 contacts one emitter region 24, probe 39 contacts the corresponding base portion 32, and probe 40 contacts the collector wafer 12. The emitter probe 38 is then biased negative with respect to the base probe 39, the collector probe 40 is biased positive with respect to the base probe 39, and a constant current signal is impressed onto the emitter probe 38. The external circuitry required for proper biasing and signal generation is shown, but not numbered, in FIG. 5. The gain between the emitter and the collector may then be measured in a well-known manner, by applying the input and output signals to a curve-tracer and determining the change in collector current with respect to the change in base current ($\Delta I_d/\Delta I_b$). If the gain measured is below a desired minimum, the body 10 is again placed in a diffusion furnace, and the emitter regions are rediffused until the desired gain is achieved.

Figure 6:
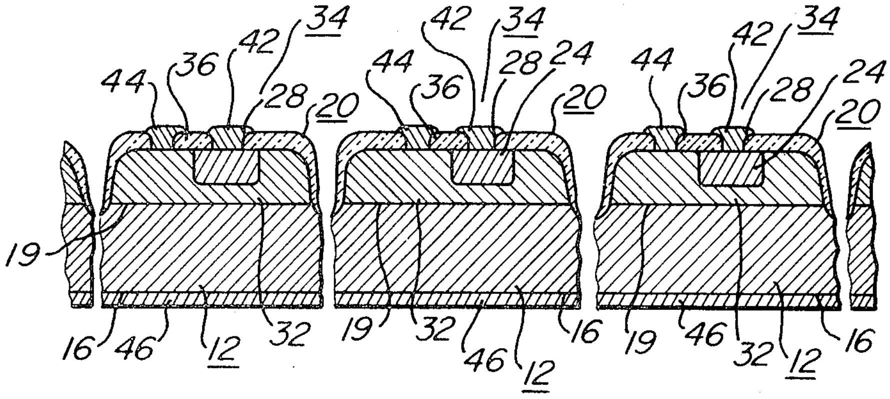

Noting FIG. 6, an emitter contact 42 and a base contact 44 are deposited into the emitter and base contact apertures 28 and 36 respectively, to provide ohmic contact to those regions. A metal layer 46 deposited on the lower surface 16 of the collector wafer 12 provides a collector contact. The body 10 is thereafter mesa-etched through the isolation grid 26 and down to the collector-base junction 19. The body 10 is then scribed and diced into individual transistors, and the base region portion 32 of each transistor 34 is edge-passivated with an insulating material like that of the insulating coating 20.

While the isolation process has been described above with respect to the epitaxial-base method for making transistors, it will be understood that this isolation process is suitable for any method that this isolation process is suitable for any method in which, during processing, the wafer includes a uniformly thick collector layer, and a uniformly thick base layer adjacent to the collector layer.

Further, the present invention provides a method for isolating transistors during the fabrication process so that the gain of each device may be measured and adjusted prior to final dicing of the wafer. This isolation method does not materially affect the characteristics of the device, does not affect the yield rate of a given wafer, and does not require additional processing steps.

I claim:

1. A method for making a plurality of transistors from a body of semiconductor material having a first conductivity-type collector layer within said body, and a second conductivity-type base layer within said body adjacent said collector layer, comprising the steps of:
  - diffusing a plurality of separate first conductivity-type emitter regions into said base layer;
  - diffusing a contiguous first conductivity-type region into said base layer and between adjacent emitter regions to completely surround and electrically isolate each emitter region and a corresponding portion of said base layer proximate to each emitter region, so that each isolated emitter region, each corresponding isolated portion of said base layer and a corresponding portion of said collector layer from a transistor in said body;
  - determining a gain figure-of-merit for one of said transistors; and then
  - separating each transistor from said body.

2. A method according to claim 1, including the additional step of rediffusing said emitter regions before said separating step, when the gain is determined to be below a desired minimum.

3. A method according to claim 1, including the step of diffusing said contiguous region during said emitter diffusing step.

4. A method according to claim 1, wherein said collector layer, said emitter regions, and said contiguous region are N type and said base layer is P type.

5. A method according to claim 4, wherein said gain determining step comprises:
  - biasing one of said emitter regions negative with respect to the corresponding isolated base layer portion;
  - biasing said collector layer positive with respect to said base layer portion;
  - impressing a constantc urrent signal on said emitter region; and
  - measuring the gain between said emitter region and said collector layer.

6. A method according to claim 1, wherein said base layer is formed by the step of depositing an epitaxial layer on said collector layer prior to said emitter diffusion step.

References Cited

UNITED STATES PATENTS

| | | | |
|---|---|---|---|
| 3,165,811 | 1/1965 | Kleimack et al. | 148—175 X |
| 3,290,179 | 12/1966 | Goulding | 148—1.5 |
| 3,317,359 | 5/1967 | Engbert | 148—186 |
| 3,421,057 | 1/1969 | Bilous et al. | 317—235 |
| 3,445,736 | 5/1969 | Navon et al. | 317—235 |
| 3,473,976 | 10/1969 | Castrucci et al. | 148—175 |
| 3,484,932 | 12/1969 | Cook | 29—574 X |

FOREIGN PATENTS

| | | | |
|---|---|---|---|
| 993,388 | 5/1965 | Great Britain | 317—235 UX |

L. DEWAYNE RUTLEDGE, Primary Examiner
W. G. SABA, Assistant Examiner

U.S. Cl. X.R.

29—574; 148—1.5, 187; 317—235 R